United States Patent [19]

Cadalora et al.

[11] 4,007,429
[45] Feb. 8, 1977

[54] PHASE-LOCKED LOOP HAVING A SWITCHED LOWPASS FILTER

[75] Inventors: Fulvio Cadalora, Mac Mahon; Pietro Ferrari, Col Moschin, both of Italy

[73] Assignee: GTE International Incorporated, Stamford, Conn.

[22] Filed: Jan. 19, 1976

[21] Appl. No.: 650,057

[52] U.S. Cl. .................................. 331/17; 331/25
[51] Int. Cl.² ........................................ H03B 3/04
[58] Field of Search ...................... 331/17, 18, 25

[56] References Cited
UNITED STATES PATENTS

| | | | |
|---|---|---|---|
| 3,447,084 | 5/1969 | Haner et al. | 325/49 |
| 3,909,735 | 9/1975 | Anderson et al. | 331/17 X |

*Primary Examiner*—Siegfried H. Grimm
*Attorney, Agent, or Firm*—Theodore C. Jay, Jr.; Douglas M. Gilbert

[57] ABSTRACT

A phase-locked loop is disclosed having a phase comparator, a switched lowpass filter, a voltage controlled oscillator, a loss of lock detector, and a charging circuit. The switched lowpass filter has two different bandwidths: the first bandwidth has a wide frequency response for use during acquisition periods for rapid acquisition, and a second bandwidth has a very narrow bandwidth for use during normal tracking for tight control of the voltage controlled oscillator. A loss of lock detector controls the particular filter bandwidth state by causing certain filter components to be switched in and out according to the presence or absence of phase lock condition. A charging circuit, used in conjunction with the particular lowpass filter section not operative during acquisition, charges the energy storage components used in this section of the filter to preclude transients from occurring when these components are switched back into the lowpass filter.

3 Claims, 2 Drawing Figures

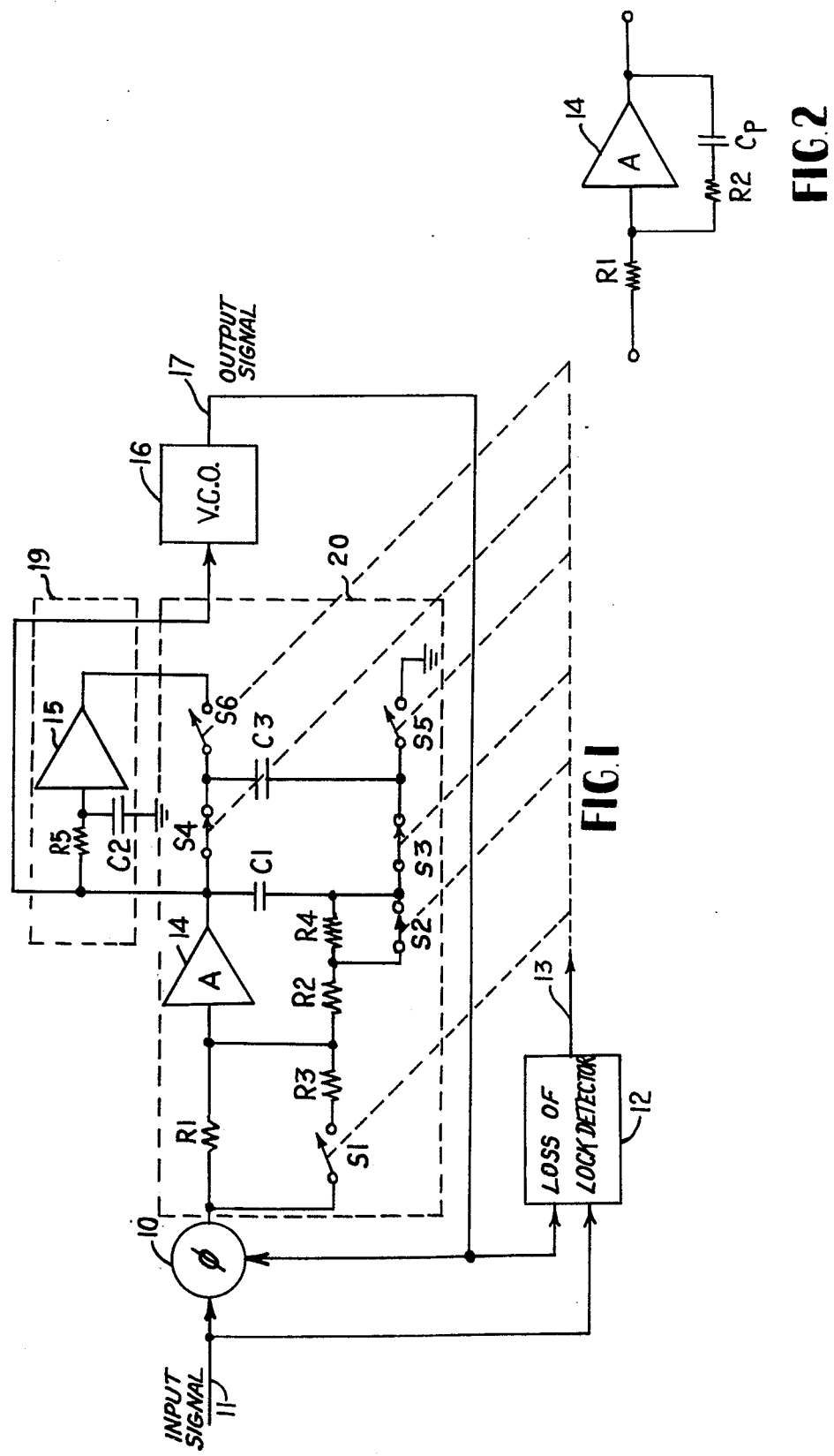

PHASE-LOCKED LOOP HAVING A SWITCHED LOWPASS FILTER

BACKGROUND OF THE INVENTION

1. Field of the Invention

This invention relates to phase-locked loops and more particularly, to the optimization of acquisition time and tracking control of phase-locked loops.

2. Description of the Prior Art

Phase-locked loops (PLL) have a wide range of applications. In the field of digital transmission systems PLL's are commonly used to recover the average frequency, and hence the timing information, of discontinuous pulse trains. Typically, a phase-locked loop includes a phase detector, a lowpass filter, and a voltage controlled oscillator (VCO). The phase detector measures small differences in phase between the incoming signal and the feedback signal from the VCO. Any detected difference generates an error signal which is filtered (or averaged) by the lowpass filter. The filtered error signal is then applied to the VCO in such a way as to minimize the difference signal.

In digital transmission systems tight frequency control and short acquisition times are required for optimum system operation. Unfortunately these two features are intrinsically antithetical. A reduction in acquisition time involves an increase in the loop bandwith, and a wide loop bandwith implies little or no control over the VCO. In digital timing circuits, this is particularly deleterious since a wide loop bandwith results in high output phase jitter.

Several techniques of acquisition have been suggested to find an optimal compromise between these two requirements. None of them has given truly satisfactory results. See *Phase Locked Techniques*, by Floyd M. Gardner, Section 4—4, "Techniques of Acquisition", John Wyley and Sons, Inc. 1966. One such known technique employs a loop with two different bandwidths. For acquisition a wide bandwidth is used and for tracking a considerably narrower one is used. To change bandwidths only resistors, i.e. non-energy storage components, have been used since an unchanged capacitor or inductor switched back into a filter would likely disturb the filter voltages and in the process upset the loop lock. This restriction on filter design does not provide completely satisfactory phase-locked loop results. Only limited changes in bandwidth can be obtained from resistive component changes. The invention herein discloses a method which overcomes this phase-locked loop design restriction.

Accordingly it is a broad object of the present invention to improve the acquisition period of a phase-locked loop having tight bandwidth control.

More particularly it is an object of this invention to provide a method of switching out during the acquisition period certain filter elements including capacitors, and then switching these filter elements back into the filter circuit for narrow bandwidth control.

SUMMARY OF THE INVENTION

The phase-locked loop described herein comprises a phase comparator, a VCO, a lowpass filter having two mutually exclusive bandwidth states, a loss of lock detector controlling the particular bandwidth state, and a charging circuit for use with the lowpass filter. During the initial acquisition period, or during transient frequency excursions when the loop is out of lock, certain filter components are switched out of the filter circuit thus increasing the filter bandwidth. Also during this acquisition period, a charging circuit charges all energy storage components out of the filter circuit, so that when a locked condition is obtained, the energy storage components will not cause a transient condition throwing the loop out of lock when switched back into the filter. The switched filter components provide a second bandwidth state to the lowpass filter. The second bandwidth state is a narrow loop bandwidth resulting in tight control of the VCO output frequency.

BRIEF DESCRIPTION OF THE DRAWINGS

FIG. 1 shows in block diagram form, a phase-locked loop in accordance with the present invention.

FIG. 2 is a circuit diagram of the lowpass filter during normal loop tracking operation.

DETAILED DESCRIPTION OF THE DRAWINGS

From an inspection of FIG. 1, it is seen that the phase-locked loop consists of the conventional loop parts: phase comparator 10, lowpass filter 20, ad VCO 16. Besides the conventional parts of the phase-locked loop are also the loss of lock detector 12, and charging circuit 19. The input signal is applied via connection 11, to phase comparator 10. The phase comparator generates an error signal proportional to the difference in phase between the input signal on connection 11 and the phase of the output signal fed back to comparator on connection 17. This error signal is then applied to lowpass filter 20. With respect to the lowpass filter, the resistors R1 and R2, the capacitors C1 and C3, and the amplifier 14 are the usual components associated with an active lowpass filter. A passive lowpass filter could be designed for use in the phase-locked loop shown, however, an active phase-locked loop is preferable as will be discussed later. The error signal generated by phase comparator 10, is filtered by the lowpass filter 20, and is applied to VCO 16 for correcting the output frequency on 17. As thus described, the operation is no different than a standard phase-locked loop.

It is clearly seen from FIG. 1, that lowpass filter 20 has more than one transfer function F(s) due to the existence of switches S1 - S6. In fact, there are two transfer functions (referred to hereafter as filter bandwidth states). FIG. 1 indicates the position of switches S1 - S6 for one bandwidth state which would be operational for normal tracking conditions (ie. with the VCO locked on frequency). In this circuit configuration filter 20 has a narrow bandwidth for tight control of VCO 16 which is usually crystal controlled. FIG. 2 indicates the filter circuit configuration for normal tracking operation. $C_p$ is simply the parallel combination of $C_1$ and $C_3$. In this configuration, $$F(s) = \frac{A(sR_2C_p + 1)}{(1 - A)sR_1C_p + 1 + sR_1C_p}$$

During the locked condition, the input signal and output signal have a phase difference of $\pi$ radians. During initial acquisition, or during a transient period, if the phase difference approaches 0 to $2\pi$ a switch command is generated from the loss of lock detector 12. The output of the loss of lock detector 12 would normally be connected via connection 13 to a switch control circuitry which is not shown in FIG. 1. The implementation of the control circuitry depends on the type of switching devices used, e.g. transistors, relays, etc. This switch control circuitry is normally considered as a part of the loss of lock detector. A loss of lock condition initiates a switch command for S1 – S6. From a locked to an unlocked condition, the following events occur:

a. Switch S1 bypasses R1 with R3. Since R1 is much larger than R3, a substantial increase in both the natural frequency and the damping factor are affected, and therefore, a high reduction of the acquisition time is achieved.

b. The opening of switch S2 causes R2 to be incremented by the value of R4. By proper adjustment of R4, the damping factor of the filter can be maintained from one bandwidth state to another at a constant value.

c. The opening of switches S3 and S4 have the effect of removing C3 from the filtering loop and only capacitor C1 is left to keep the damping factor constant. (C1 is much less than C3). All three circuit changes tend to minimize as much as possible the acquisition time of a wide bandwidth phase-locked loop.

d. Switches S5 and S6 connect capacitor C3 between ground and the output of charging circuit 19. Charging circuit 19 consists of an integrator R5 and C2 on the input to unity gain amplifier 15.

Charging circuit 19 provides C3 with the final voltage reached at the output of amplifier 14 during the tracking period. Consequently C3 will not discharge C1 and upset the input voltage of VCO 16. Without charging circuit 19 the effect of switching such an energy storage device back into the filter circuit could cause a momentary out of lock condition.

The behavior or filter 20 as thus described, depends on whether filtering is accomplished through R1, R2, C1 + C3, (normal tracking conditions) or through R3, R2 + R4, and C1 (acquisition condition). R1, R2, C1 + C3 are dimensioned on the bandwidth features which the loop is designed to have under normal tracking conditions. Conversely, R3, R4, and C1 take on values chosen on the basis of other considerations. It is desirable to have the magnitude of R3 as small as possible. In practice R3 will consist of the internal resistance of switch S1 and the output impedance of phase comparator 10. The capacity at the output of amplifier 14 cannot be completely suppressed in order to avoid a zero damping factor. A reasonable compromise is to decrease the capacity magnitude by the same factor the resistance R1 is decreased. In addition, R4 is added to optimize the damping factor.

The proper choice of components in charging circuit 19 depend on other factors. It would appear that C2 should be reduced to zero for minimization of the acquisition period. This cannot be done because of modulation on the input signal on lead 11. In the type of digital systems discussed above, phase modulation is always present in the form of modulation and noise. This causes a frequency modulation control of VCO 16. Furthermore, this unwanted modulation of the error signal at the output of phase comparator 10 is enhanced during the acquisition transient because of the bandwidth expansion. To eliminate this unwanted modulation R5 and C2 are so dimensioned that their time constant is made equal to that of the RC time constant of the capacitor-switch arrangement. Care must be taken, however, not to increase the time constant R5 - C2 greater than what would be necessary since it would result in an unwarranted extension of the acquisition period.

At an input frequency of 8.448 MHz, an acquisition time period of 15ms is typical with a bandwidth of 10Hz. With an input frequency between 2 and 8 MHz, clearly transistors or similar devices should be used as switches S1 through S6.

Although filter 20 is shown as an active filter a completely passive device could be implemented, however, with reduced performance. An active filter provides better tracking capabilities since an active filter generally has a better frequency response (i.e. sharper filter skirts). A high gain filter also permits smaller valued capacitors ($C_p$) simplifying the charging problems.

Any number of loss of lock detectors shown as 12 in FIG. 1 may be utilized successfully. Two differentiators coupled to a NAND gate and then a monostable multivibrator was used with good results. In the above frequency range transistor switches were used with appropriate switch control circuitry. It is apparent that numerous and various other specific arrangements can readily be devised in accordance with the principles of this invention by those skilled in the art without departing from the spirit and scope of the invention. Certainly those skilled in the art can see that essentially there are two filters employed in the phase-locked loop: one having a narrow bandwidth and a second having a wide bandwidth. Instead of simply switching particular filter components, an entire filter (including amplifier 14) could be switched to provide the two bandwidth states. Clearly the charging circuit 19 would be needed in conjunction with the narrow bandwidth filter to ensure that any capacitors or inductors in the filter would not upset the input balance to the VCO when switched into operation.

What is claimed is:

1. A phase-locked loop comprising:
a phase comparator, having first and second inputs and an output, for generating an error signal proportional to the phase difference between the signals applied to said inputs, said comparator receiving an input signal at the first input;
filter means having an output and an input, said input connected to the output of said comparator and receiving said error signal, said filter means also having first and second mutually exclusive bandwidth states, said first bandwidth state operative during tracking periods and said second bandwidth state operative during acquisition periods, said filter means further having a control connection to which a control signal can be applied, and the filter bandwidth state determined by said control signal;
a voltage controlled oscillator having an input and output, said output coupled to said second comparator input, said voltage controlled oscillator generating at its output an output signal whose frequency is responsive to a signal applied to said input;
a loss of lock detector having first and second inputs connected respectively to said first and second comparator inputs, said detector further having an output to said filter control connection and generating a control signal;
charging means coupled to said filter means, for charging all energy storage components in said filter means used only during said first bandwidth state, thereby preventing voltage and current transients when said energy storage components are operatively connected for said first filter bandwidth state.

2. A phase-locked loop as in claim 1 wherein the damping factor of said filter means is the same during both first and second filter bandwidth states.

3. A phase-locked loop as in claim 2 wherein said filter means further comprises an active lowpass filter.

* * * * *